United States Patent
Ejiri et al.

(10) Patent No.: US 10,101,638 B2
(45) Date of Patent: Oct. 16, 2018

(54) WATERTIGHT STRUCTURE FOR ELECTRONIC DEVICE AND CONNECTOR

(71) Applicant: SMK Corporation, Tokyo (JP)

(72) Inventors: Koichiro Ejiri, Kanagawa (JP);
Kazunobu Yoneyama, Kanagawa (JP);
Haruhiko Kondo, Kanagawa (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 15/662,291

(22) Filed: Jul. 28, 2017

(65) Prior Publication Data
US 2018/0252988 A1 Sep. 6, 2018

(30) Foreign Application Priority Data
Mar. 3, 2017 (JP) ................................. 2017-40001

(51) Int. Cl.

| | |
|---|---|
| *G03B 17/08* | (2006.01) |
| *H05K 5/06* | (2006.01) |
| *H05K 5/00* | (2006.01) |
| *H01R 13/52* | (2006.01) |
| *H04N 5/225* | (2006.01) |
| *G03B 17/56* | (2006.01) |
| *G03B 17/14* | (2006.01) |

(52) U.S. Cl.
CPC ......... *G03B 17/08* (2013.01); *H01R 13/5202* (2013.01); *H04N 5/2252* (2013.01); *H04N 5/2257* (2013.01); *H05K 5/0017* (2013.01); *H05K 5/06* (2013.01); *G03B 17/14* (2013.01); *G03B 17/56* (2013.01); *G03B 2219/045* (2013.01); *H04N 5/2253* (2013.01); *H04N 5/2254* (2013.01)

(58) Field of Classification Search
CPC ...................................................... G03B 17/08
USPC ............................................................ 396/25
See application file for complete search history.

(56) References Cited

U.S. PATENT DOCUMENTS

| | | | | |
|---|---|---|---|---|
| 4,221,112 A | * | 9/1980 | Enomoto | G04G 9/0041 250/463.1 |
| 5,208,541 A | * | 5/1993 | Yerkovich | F02P 17/12 324/393 |
| 6,538,709 B1 | * | 3/2003 | Kurihara | G02F 1/133308 349/56 |

(Continued)

OTHER PUBLICATIONS

Henkel Corporation, 'The Design Guide for Bonding Rubber and Thermoplastic Elastomers', Loctite, vol. 2, Feb. 2005, 78 pages.*

*Primary Examiner* — Clayton E LaBalle
*Assistant Examiner* — Kevin Butler

(57) ABSTRACT

A watertight structure can improve the ease of assembly of electronic devices, facilitate manufacturing, and reduce parts counts and man-hours for assembly. The watertight structure of a touch panel device includes: a display panel constituting a display screen; a touch panel which is disposed outside the display panel and on which input operations are performed; and an enclosure which holds the display panel and the touch panel and has an opening in which the touch panel is exposed. In the structure, a thermoplastic decorative film is brought into close contact with the surface of the touch panel device along the entire periphery so that there exists no excessive portion of the decorative film that is protruded from the surface of the touch panel device.

2 Claims, 14 Drawing Sheets

(56) References Cited

U.S. PATENT DOCUMENTS

| | | | | |
|---|---|---|---|---|
| 7,626,809 | B2* | 12/2009 | Tai | G02F 1/133308 361/679.21 |
| 9,127,186 | B2* | 9/2015 | Arita | H01L 23/291 |
| 9,887,724 | B2* | 2/2018 | Takahashi | H04B 1/3888 |
| 2005/0279661 | A1* | 12/2005 | Hodges | H01H 9/0242 206/320 |
| 2006/0124482 | A1* | 6/2006 | Hodges | H01H 9/0242 206/320 |
| 2008/0055258 | A1* | 3/2008 | Sauers | G06F 1/1626 345/173 |
| 2008/0206498 | A1* | 8/2008 | Allen | B29C 63/42 428/34.9 |
| 2012/0019370 | A1* | 1/2012 | Mironichev | G08C 17/02 340/12.5 |
| 2013/0176691 | A1* | 7/2013 | Stevens | H05K 3/28 361/748 |
| 2013/0236719 | A1* | 9/2013 | Ohwada | B29C 51/002 428/327 |
| 2014/0152890 | A1* | 6/2014 | Rayner | G06F 1/1626 348/376 |
| 2017/0218226 | A1* | 8/2017 | Ho | C09D 175/02 |
| 2018/0002573 | A1* | 1/2018 | Kawakita | C09J 7/0267 |

\* cited by examiner

WATERTIGHT STRUCTURE FOR ELECTRONIC DEVICE AND CONNECTOR

CROSS REFERENCE TO RELATED APPLICATION

The contents of the following Japanese patent application are incorporated herein by reference, Japanese Patent Application No. 2017-40001 filed on Mar. 3, 2017.

FIELD

The present invention relates to a watertight structure for an electronic device and a connector in which a film is brought into close contact with the electronic device and the connector.

BACKGROUND

Electronic devices such as mobile phones, digital cameras, and personal computers are used in a variety of environments including not only indoors but also outdoors. For electronic devices, in general, entry of a liquid such as water into the enclosure is apt to compromise the functions thereof, and in order to prevent this, various measures for watertightness have been taken.

Known as a measure for watertightness of such an electronic device is a structure in which a liquid crystal display panel used in mobile phones or personal computers is laminated with an adhesive heat-shrinkable film in order to enhance resistance to water (for example, see Patent Literature 1).

CITATION LIST

Patent Literature

Patent Literature 1: Japanese Patent Application Laid-Open No. Hei. 11-259021

SUMMARY

Technical Problem

However, as shown in FIG. 17, since the liquid crystal display panel disclosed in Patent Literature 1 is laminated with a film on the panel display surface and the rear surface, the lapped joint of the film is protruded from a side of the panel display surface. This lapped joint causes trouble when the liquid display panel is disposed in an enclosure, impairing the ease of assembly.

On the other hand, the watertight structure implemented by bonding together parts that constitute an electronic device and the watertight structure that employs a watertight O-ring are generally employed. However, since these watertight structures require the bonding step, the degree of difficulty of manufacturing the electronic device is increased, with increases in parts count and man-hour for assembly.

Solution to Problem

The present invention has been made in order to address such problems. It is an object of the present invention to provide a watertight structure for an electronic device which improves the ease of assembly of the electronic device, facilitates manufacturing, and reduces parts counts and man-hours for assembly.

In order to achieve the aforementioned object, a watertight structure of an electronic device according to one aspect of the present invention is configured such that a thermoplastic film is brought into close contact with a surface of the electronic device so that there exists no excessive portion of the film protruded from the surface of the electronic device.

This configuration enables the thermoplastic film brought into close contact with the surface of the electronic device to prevent the entry of a liquid such as water into the enclosure of the electronic device. Furthermore, since there exists no excessive portion of the film protruded from the surface of the electronic device, no projected portion of the film that would otherwise cause trouble at the time of assembly of the electronic device is found, thereby improving the ease of assembly.

Furthermore, the watertight structure is implemented by the film being brought into close contact with the surface of the electronic device. This eliminates the need of providing watertightness by bonding together parts that constitute the electronic device, thereby simplifying the manufacture of the electronic device. Furthermore, since watertight parts such as O-rings need not to be used, parts counts and man-hours for assembly can be reduced.

In the aforementioned watertight structure of the electronic device, the film may also be brought into close contact with the surface of the electronic device along the entire periphery thereof.

Since this configuration allows the film to be brought into close contact with the surface of the electronic device along the entire periphery thereof, it is possible to prevent the entry of a liquid such as water into the electronic device with reliability.

In the aforementioned watertight structure of the electronic device, the film may also be brought into close contact with a bonded portion on the surface of the electronic device.

This configuration allows the film to be brought into close contact with the bonded portion on the surface of the electronic device. This makes it possible to prevent the entry of a liquid such as water into the electronic device with a less amount of the film as compared with the case in which the entire periphery is in close contact therewith.

In the aforementioned watertight structure of the electronic device, the electronic device may also be configured as a touch panel device.

This configuration allows the watertight structure of the touch panel device to improve the ease of assembly of the touch panel, facilitate manufacturing, and reduce parts counts and man-hours for assembly.

In the aforementioned watertight structure of the touch panel device, the touch panel device may have: a display panel constituting a display screen; a touch panel which is disposed outside the display panel and on which an input operation is performed; and an enclosure which holds the display panel and the touch panel and has an opening to which the touch panel is exposed. The film may be configured to cover at least the opening.

Since this configuration allows the opening to be covered with the film, it is possible to prevent the entry of a liquid such as water through a gap between the touch panel and the enclosure in the opening.

In the aforementioned watertight structure of the electronic device, the electronic device may also be configured as a camera module.

This configuration allows the watertight structure of the camera module to facilitate manufacturing and reduce parts counts and man-hours for assembly.

In the aforementioned watertight structure of the camera module, the camera module may have: an accommodation portion formed by bonding two or more casings together; a lens unit including an objective lens at the top in the accommodation portion; an image capturing element; and a printed circuit board. One of the two or more casings may have an opening on the upper surface for exposing the objective lens. The film may also be configured to cover at least the opening and a casing bonded portion at which the two or more casings have been bonded together.

This configuration allows the watertight structure of the camera module to prevent the entry of a liquid such as water into the camera module through the casing bonded portion and the opening because the casing bonded portion and the opening are covered with the film in close contact therewith.

A watertight structure of a connector according to another aspect of the present invention is configured such that a thermoplastic film is brought into close contact with a surface of the connector including a housing having a plurality of holes to be used with an electronic device.

Since this configuration allows the connector to be brought into close contact and covered with the film, it is possible to prevent the entry of a liquid such as water, which has entered from outside into the connector, through a hole into the electronic device.

The aforementioned watertight structure of the connector may also be configured such that the thermoplastic film is brought into close contact with the plurality of holes on the surface of the connector. This configuration allows the film to be brought into close contact with the plurality of holes on the surface of the connector. This makes it possible to prevent the entry of a liquid such as water into the electronic device with a less amount of the film as compared with the case in which the film is in close contact with the entire periphery.

The aforementioned watertight structure of the connector may also be configured such that the connector includes an IC card insertion port in the housing, and the thermoplastic film is brought into close contact with the surface of the connector except the IC card insertion port.

This configuration allows the watertight structure of the card connector to facilitate manufacturing and reduce parts counts and man-hours for assembly.

According to the aspect(s) of the present invention, the watertight structure of an electronic device can improve the ease of assembly of an electronic device, facilitate manufacturing, and reduce parts counts and man-hours for assembly.

DESCRIPTION OF EMBODIMENTS

Now, referring to FIGS. 1 to 3, a description will be given of a watertight structure for an electronic device according to an embodiment.

First Embodiment

In this embodiment, a touch panel device is taken as an example of electronic devices to describe the watertight structure for the touch panel device. The touch panel device is used as an input device that also acts as various types of display panels, for example, for a portable information terminal, a computer display, a car navigation system, and an ATM, a ticket vending machine.

Figure 1:
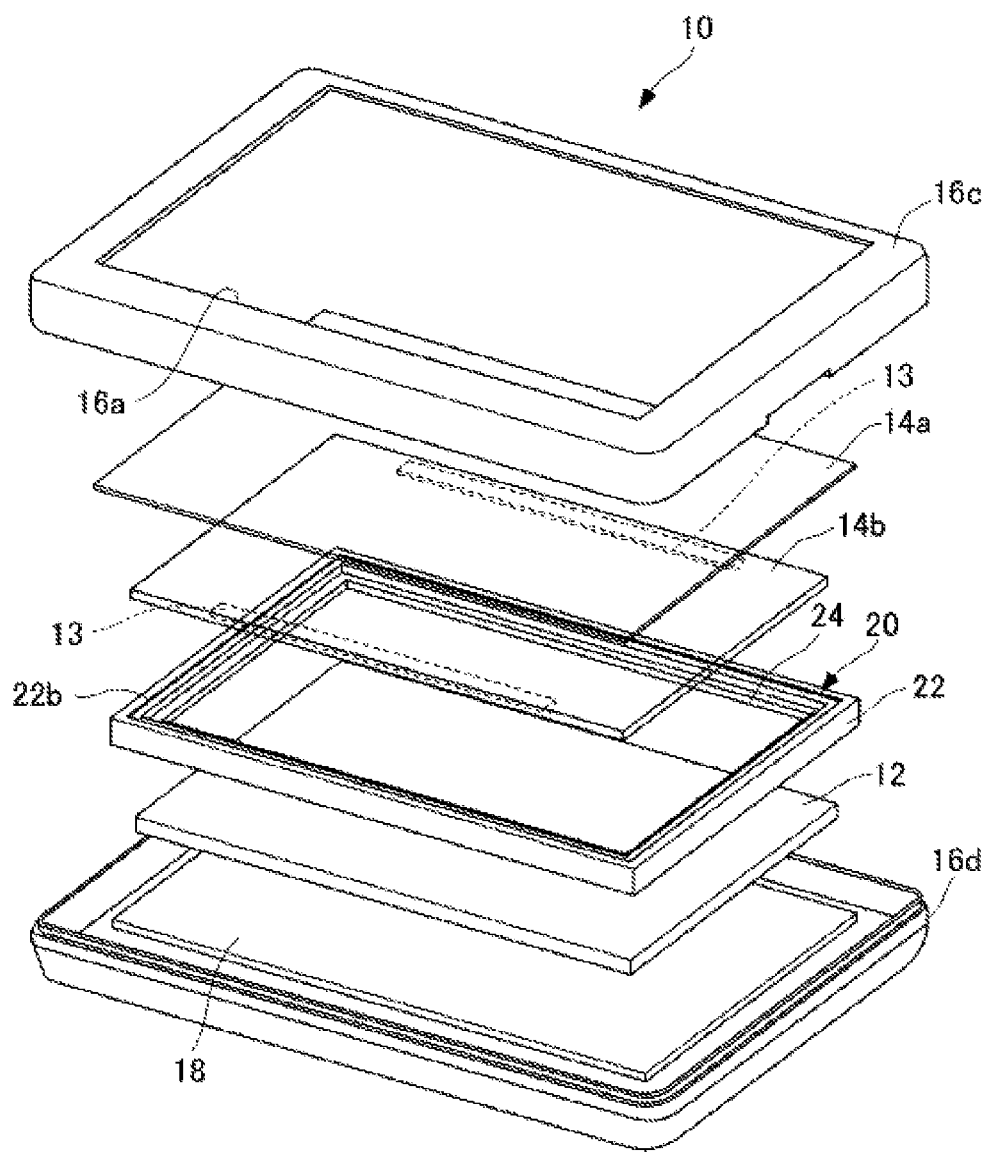
FIG. 1 is an exploded perspective view illustrating a touch panel device according to a first embodiment.

As shown in FIG. 1, a touch panel device 10 includes a display panel 12 such as a liquid crystal display panel or an EL display panel, and a touch panel 14 on which an input operation is performed. The touch panel device 10 further includes an enclosure 16 which accommodates the display panel 12 and the touch panel 14 and is formed of a resin or the like.

The periphery of the touch panel device 10 is entirely in close contact with a decorative film 17 that has been processed by the TOM (Three dimension Overlay Method) construction method to be discussed later. An excessive portion of the decorative film 17 that is not in close contact with the surface of the touch panel device 10, that is, the excessive portion that is protruded from the surface of the touch panel device 10 is cut off in advance by trimming as will be discussed later. Thus there exists no excessive portion of the decorative film 17.

Although the decorative film 17 is formed of polyethylene terephthalate, any other raw material may also be employed only if the material is thermoplastic. Examples of the other materials to be used may include polybutylene terephthalate, polyethylene naphthalate, polyimide, polyamide, polycarbonate, polyvinyl chloride, polyethylene, polypropylene, and polystyrene. Furthermore, the decorative film 17 is desirably transparent.

Paths through which a liquid possibly enters into the touch panel device 10 may be thought to include a gap 25 between the rear surface of the peripheral edge portion around an opening 16a of the enclosure 16 and the touch panel 14, and a bonded portion 26 between a front portion 16c and a rear portion 16d of the enclosure 16. The decorative film 17 is brought into close contact with the touch panel device 10 so as to make the touch panel device 10 watertight. Thus, as shown in FIG. 3, it is also acceptable to make the decorative film 17 cover not the entire periphery of the touch panel device 10 but at least the opening 16a, the gap 25, and the bonded portion 26.

The enclosure 16, which is formed by dividing a generally quadrangular box into two in the horizontal direction, includes the front portion 16c with the opening 16a formed and the rear portion 16d which is equivalent in size to the front portion 16c and mated with the front portion 16c to form the enclosure 16. The enclosure 16 holds the display panel 12 and the touch panel 14. The touch panel 14 is exposed to outside in the opening 16a. Furthermore, accommodated in the enclosure 16 are a circuit board 18 including various types of circuits (not shown), a power supply, and other electronic components, all of which are secured to a chassis 19 provided integrally with the rear portion 16d of the enclosure 16.

The touch panel 14 is disposed outside the display panel 12 for performing input operations thereon. In the touch panel 14, for example, a flexible substrate 14a formed from a PET resin sheet is positioned on the front surface of the touch panel 14, while on the rear surface thereof is provided a glass substrate 14b, with a certain separation therebetween. On the mutually opposing surfaces of the flexible substrate 14a and the glass substrate 14b, there are formed a transparent ITO film in a predetermined pattern by vapor deposition or the like as a contact electrode, with an input/output electrode connected to the end of the ITO film.

Then, dot spacers are provided between the two upper and lower substrates, on each of which the ITO film is formed, to confront each other. Pressing the flexible substrate 14a causes the confronting ITO film contacts of the flexible substrate 14a on the front side and the glass substrate 14b on the rear side to be brought into contact with each other. Depending on the resistance value at that time, the position of the pressing on the touch panel 14 can be detected. The flexible substrate 14a is formed to be a size larger than the glass substrate 14b around the entire periphery, so that the flexible substrate 14a or a resin sheet is extended from around the entire periphery of the glass substrate 14b.

On the outer sides of a pair of mutually opposing side edge portions of the glass substrate 14b of the touch panel 14, there is provided a piezoelectric element 13 of a predetermined length for making full use of a force feedback function. The length of the piezoelectric element 13 does not need to be the entire length of one side of the touch panel 14, but the length is preferably about one half the length of one side or greater. The piezoelectric elements 13 are embedded in an elastic adhesive and adhered to the glass substrate 14b of the touch panel 14.

The display panel 12 constitutes a display screen. The touch panel 14 and the display panel 12 are fitted into a support framework 20 of a resin or rubber such as urethane or silicone having a certain strength. As shown in FIG. 1, the support framework 20 has a rectangular frame shape, and includes a rectangular sidewall 22, a projected edge portion 22a formed on the upper surface of the sidewall 22 around the entire periphery thereof, and a panel receiver 24 extended by a certain width inwardly at a right angle from the center of the inner peripheral surface of the sidewall 22 around the entire periphery thereof. The panel receiver 24 includes a display panel receiver surface 24a on the rear side and a touch panel receiver surface 24b facing outward.

Figure 2:
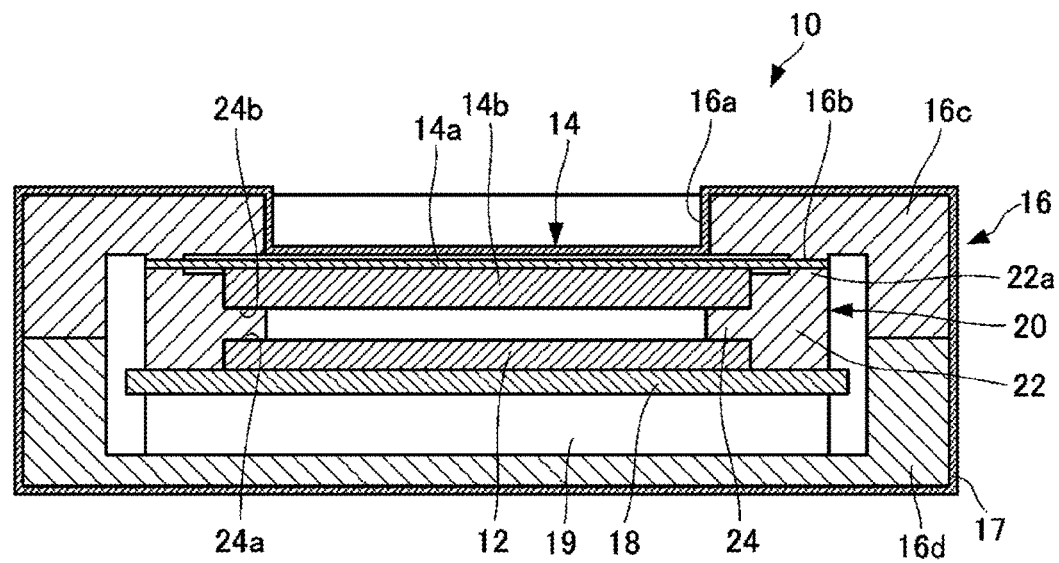
FIG. 2 is a longitudinal cross-sectional view illustrating a decorative film brought into close contact with the entire periphery of a touch panel device according to the first embodiment.
Figure 3:
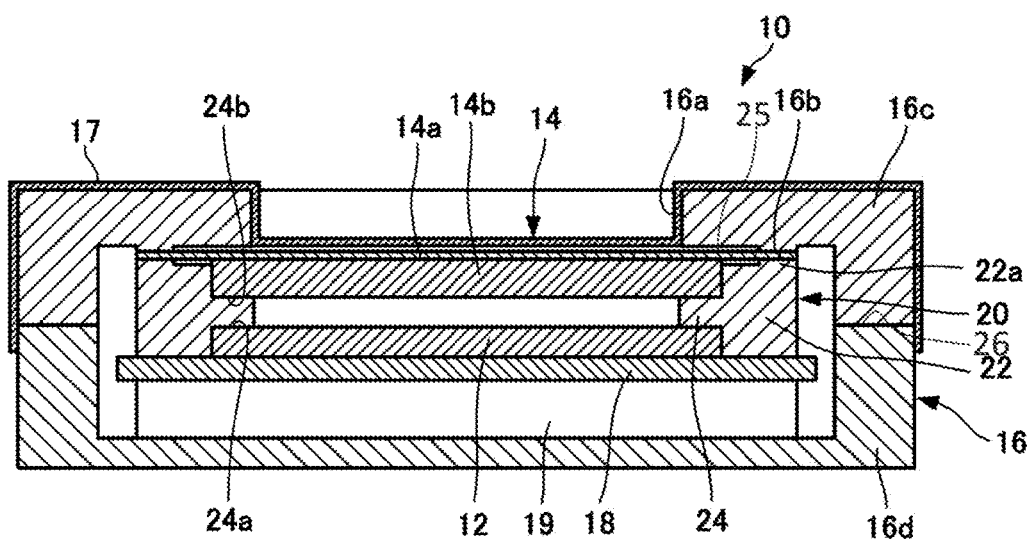
FIG. 3 is a longitudinal cross-sectional view illustrating a decorative film brought into close contact with part of the touch panel device according to the first embodiment.

When assembled, as shown in FIG. 2, the support framework 20 allows the display panel 12 to be fitted into the frame of the support framework 20 from the rear side thereof, so that the entire periphery of the peripheral edge portion of the display panel 12 is brought into contact with the display panel receiver surface 24a of the panel receiver 24 to thereby be positioned. The peripheral edge portion of the display panel 12 and the display panel receiver surface 24a are bonded to each other by an adhesive. Note that the aforementioned part may not always have to be bonded to each other because the sidewall 22 surrounds the display panel 12. The touch panel 14 is fitted onto the touch panel receiver surface 24b of the support framework 20. In this state, the piezoelectric elements 13 on the side edge portions of the touch panel 14 are accommodated in the space defined by the thickness of the panel receiver 24.

The support framework 20 holds the display panel 12 and the touch panel 14 and is accommodated in the enclosure 16 and supported by the chassis 19 with the circuit board 18 interposed therebetween. In this state, as shown in FIG. 2, the peripheral edge portion of the flexible substrate 14a of the touch panel 14 is sandwiched and thereby securely held between a holding projection 16b formed on the rear surface of the peripheral edge portion of the opening 16a of the enclosure 16 along the entire periphery thereof and the projected edge portion 22a formed along the entire periphery on the upper surface of the sidewall 22 of the support framework 20. This allows the opening 16a of the enclosure 16 to be blocked by the flexible substrate 14a of the touch panel 14, thereby preventing the entry of dust particles or water through the opening 16a.

For the watertight structure of a related touch panel device, an adhesive was applied to a gap between the opening 16a of the enclosure 16 and the touch panel 14 so as to provide an adhesion structure, thereby making the assembly watertight. To provide the adhesion structure, a highly accurate adhesion step is required, which has made the manufacture of the touch panel device difficult. In the touch panel device 10 according to this embodiment, the entire periphery, including the opening 16a, is covered with the decorative film 17 brought into close contact therewith. Thus, the adhesion structure is not required to be provided, so that the manufacturing process can be simplified.

Each of the piezoelectric elements 13 is connected to a piezoelectric element driving circuit (not shown) for allowing the piezoelectric element 13 to produce vibrations and for imparting a force feedback function for providing a sense of operation to the presser. Furthermore, a cable (not shown) is connected to the electrodes on the side edge portions of the touch panel 14 so as to enable input information to be communicated to a control unit inside the enclosure 16.

Referring to FIGS. 4 to 10, a description will be given of the TOM (Three dimension Overlay Method) construction method to be employed in this embodiment. The TOM construction method is a technique for applying a decorative film to a formed body having a three-dimensional structure.

Figure 4:
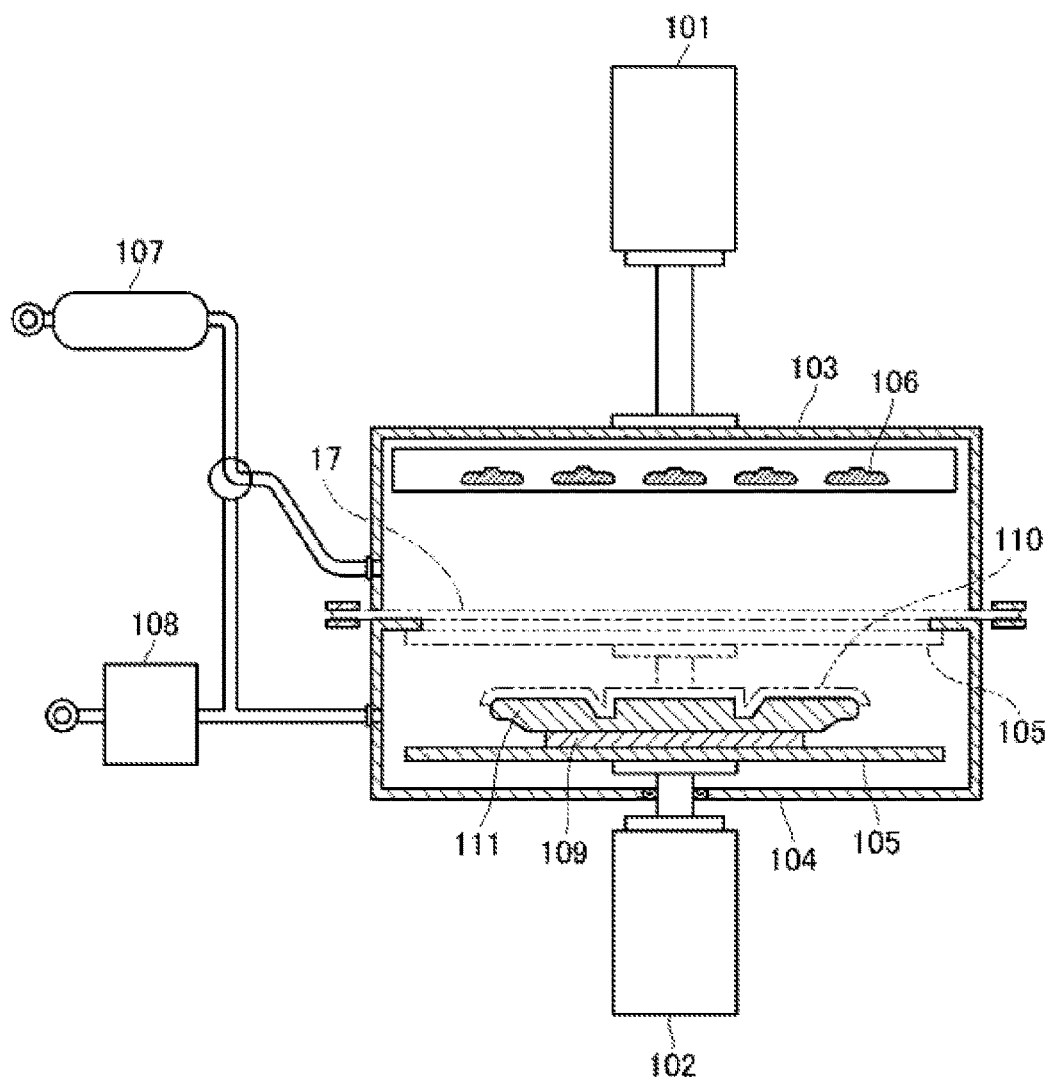
FIG. 4 is a cross-sectional view illustrating an entire configuration of a forming apparatus according to the first embodiment.

FIG. 4 is a cross-sectional view illustrating the entire configuration of a forming apparatus 100. The forming apparatus 100 includes driving devices 101 and 102, an upper chamber box 103, a lower chamber box 104, a table 105, a heater 106, a pressurized air tank 107, and a vacuum tank 108.

The upper chamber box 103 and the lower chamber box 104 define, in a vertical pair, an accommodation space in the forming apparatus 100. The upper chamber box 103 is movable up and down by drive force produced by the driving device 101. When the upper chamber box 103 is moved upward to be separated from the lower chamber box 104, a side of the forming apparatus 100 is opened so that a base member 110 can be taken into or out of the accommodation space R.

The table 105 has a mount 109 for placing the base member 110 thereon and a receiver jig 111 for receiving the base member 110, and can be moved up and down by the drive force produced by the driving device 102. In FIG. 4, the table 105 that has been lowered is shown by solid lines, and the table 105 that has been lifted is shown by dotted lines. As the base member 110, it is possible to make selections from a wide variety of objects having various shapes that need to be laminated with a film, such as electronic devices, electronic components, interior and exterior building materials, and interior and exterior automobile components. In this embodiment, the touch panel device 10 is employed as the base member 110, and the portion that includes the entire periphery or the opening 16a of the touch panel device 10 is covered with the decorative film 17 in close contact therewith.

The receiver jig 111 to be employed may conform to the shape of the base member 110. When the decorative film 17 is brought into close contact with the base member 110, the heater 106 heats the decorative film 17 to a predetermined temperature and thereby softens the same. For example, an infrared heater may be employed as the heater 106.

The vacuum tank 108 vacuums the accommodation space R inside the forming apparatus 100. The pressurized air tank 107 draws compressed air into a space above the decorative film 17 in the accommodation space R.

A description will now be given of a step of bringing the decorative film 17 into close contact with the base member 110.

Figure 5:
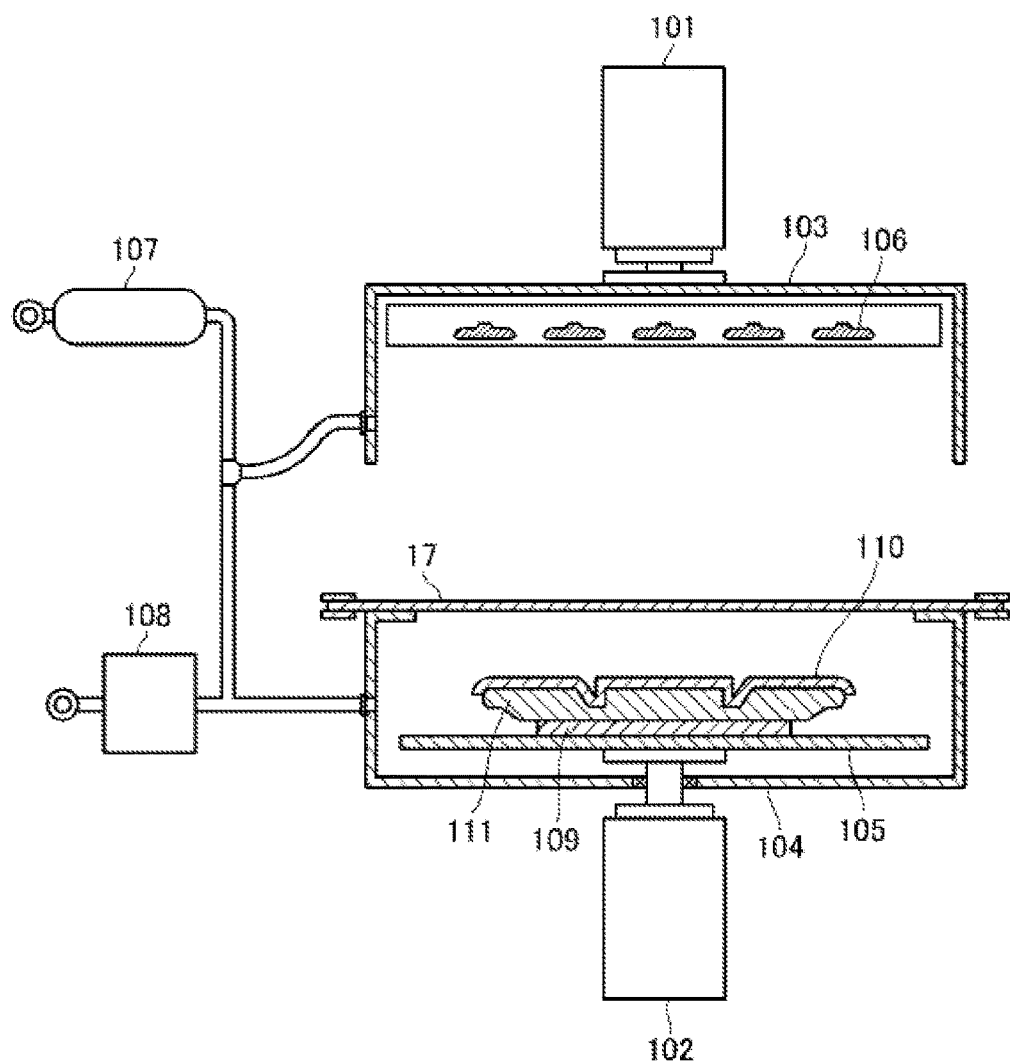
FIG. 5 is a cross-sectional view illustrating a base member and a decorative film supplied to the forming apparatus according to the first embodiment.

As shown in FIG. 5, with the upper chamber box 103 lifted, the base member 110 and the decorative film 17 are set inside the forming apparatus 100. The decorative film 17 is made up of three layers, for example, a transparent film, a decorative layer, and an adhesion layer. Alternatively, the decorative film 17 may also be made up of a decorative layer, an easy-forming film, and an adhesion layer. Furthermore, the surface of the decorative film 17 may be etched in sawtooth shapes.

Figure 6:
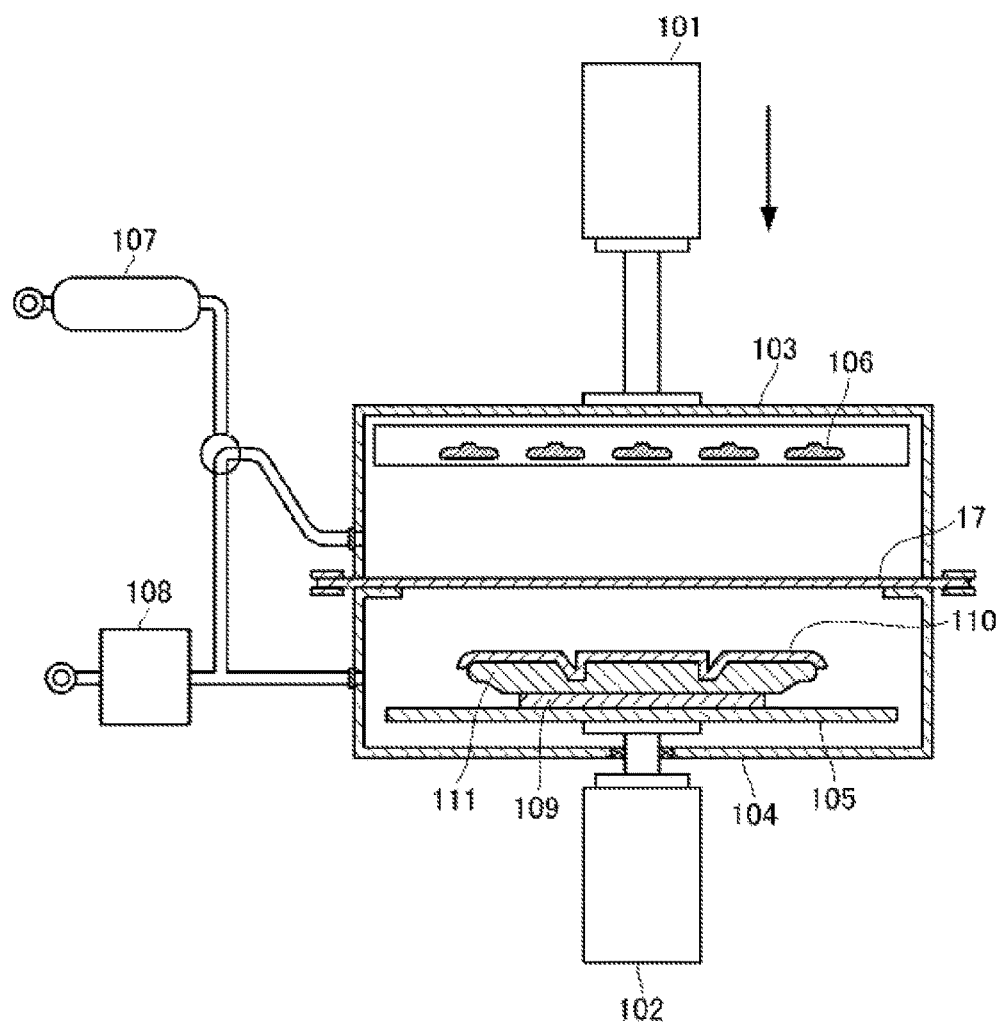
FIG. 6 is a cross-sectional view illustrating an upper chamber box having been lowered in the forming apparatus according to the first embodiment.

After the base member 110 and the decorative film 17 are set in the forming apparatus 100, as shown in FIG. 6, the upper chamber box 103 is lowered to divide the accommodation space R into two spaces R1 and R2 with the decorative film 17 therebetween.

Figure 7:
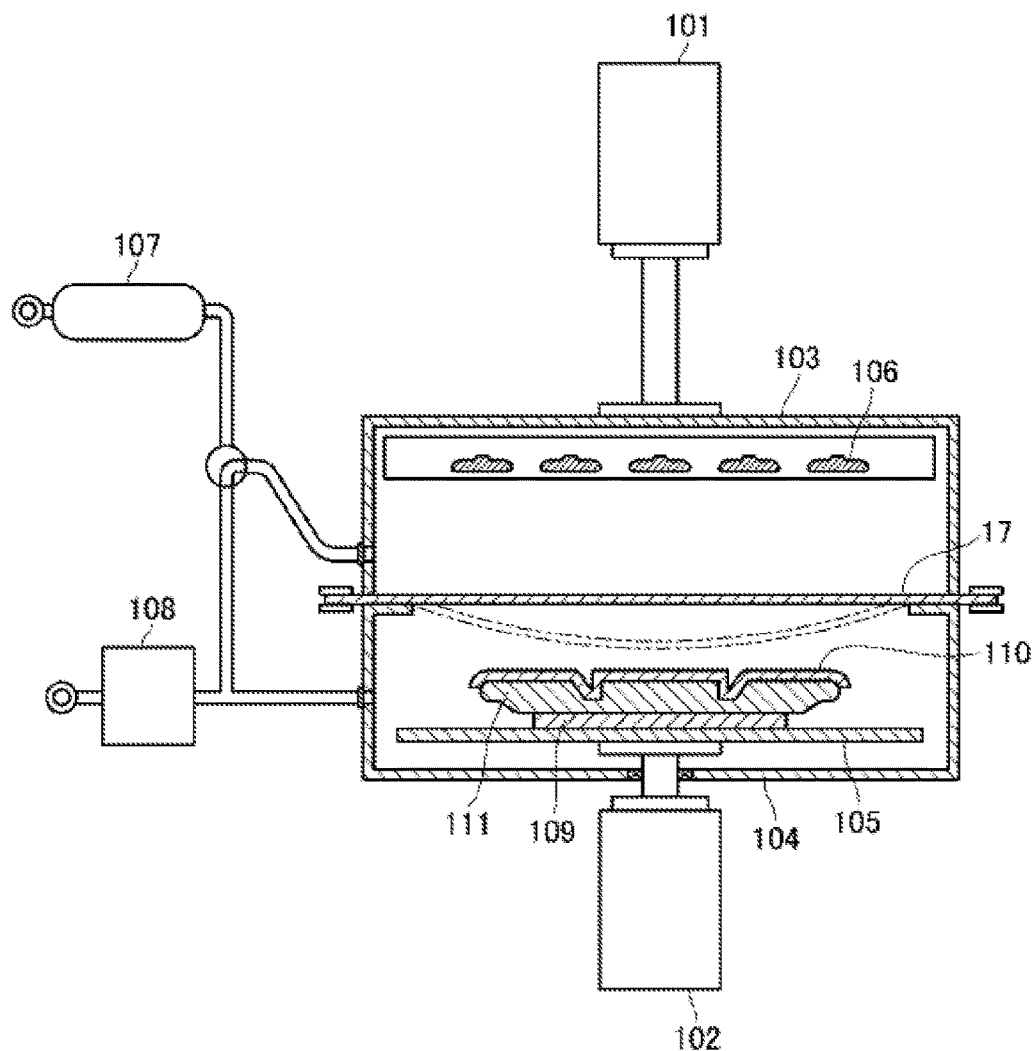
FIG. 7 is a cross-sectional view illustrating the forming apparatus during heating according to the first embodiment.

Then, the spaces R1 and R2 are vacuumed by the vacuum tank 108 to produce a vacuum. After the spaces R1 and R2 have been vacuumed, the heater 106 heats the decorative film 17 by radiation. When heated, the decorative film 17 is softened, and as shown in FIG. 7, deflected downward.

Figure 8:
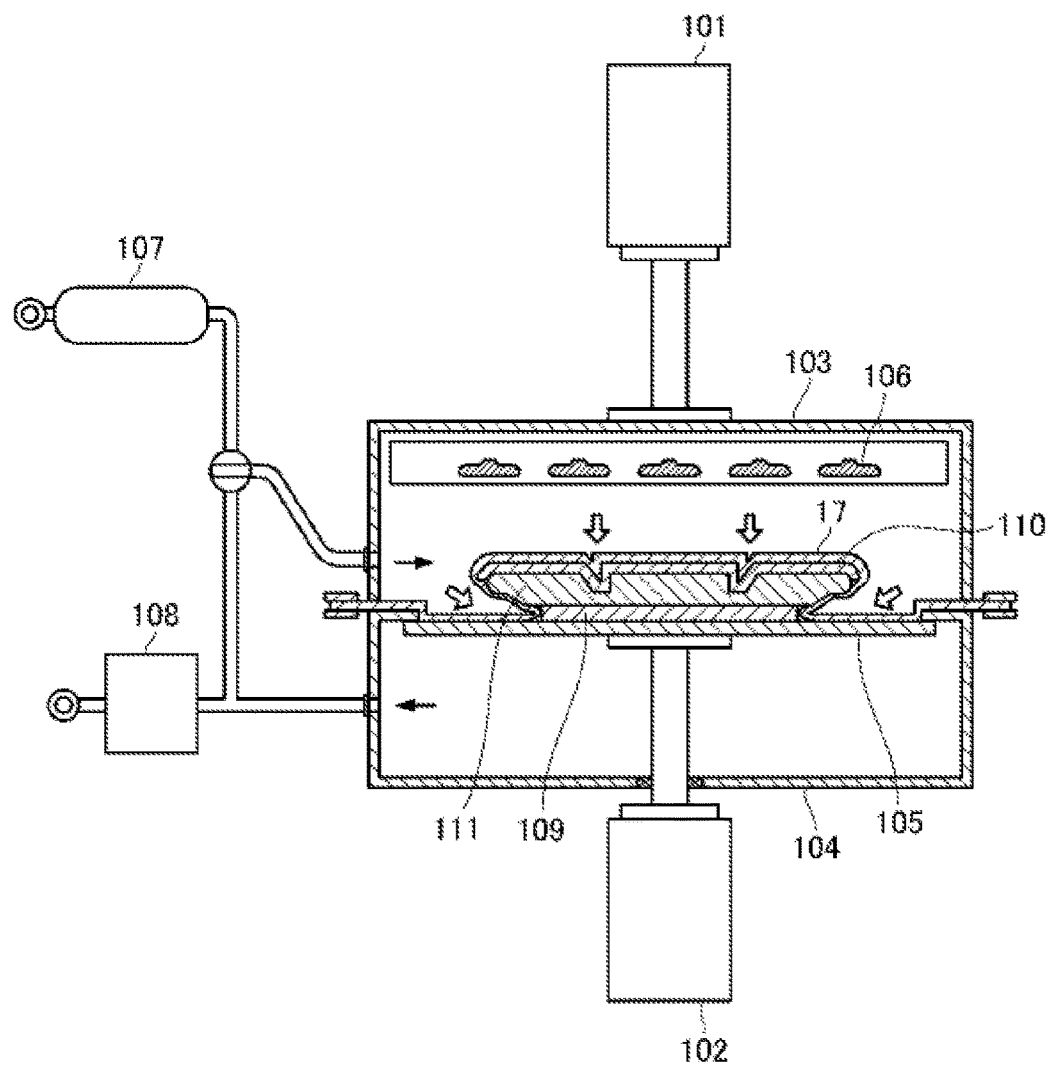
FIG. 8 is a cross-sectional view illustrating the forming apparatus opened to the atmosphere according to the first embodiment.

After the table 105 is lifted with the decorative film 17 being deflected, the accommodation space R1 is opened to the atmosphere as shown in FIG. 8, so that the decorative film 17 is brought into close contact with the base member 110 with the help of the pressurizing force by the atmospheric pressure. To bring the decorative film 17 into much closer contact with the base member 110, compressed air may also be sent into the accommodation space R1 from the pressurized air tank 107 for pressurization.

Figure 9:
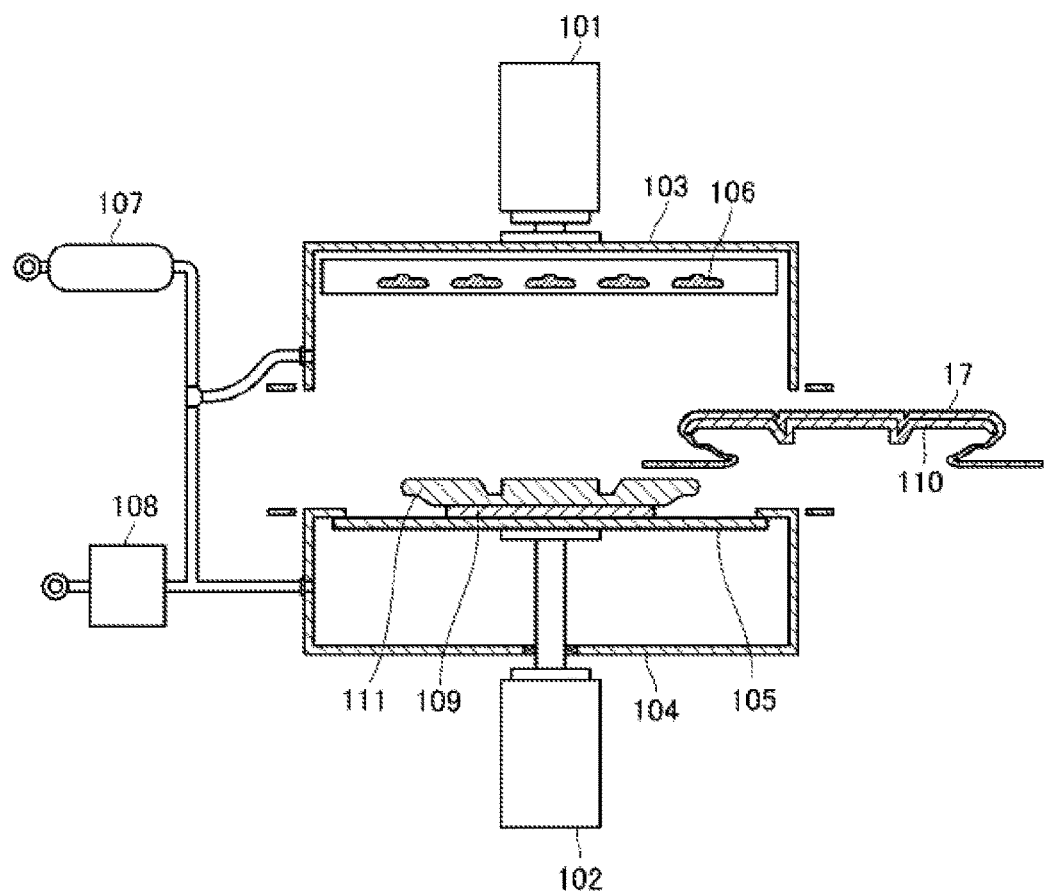
FIG. 9 is a cross-sectional view illustrating the base member, with which a decorative film has been brought into close contact, being extracted from the forming apparatus according to the first embodiment.
Figure 10:
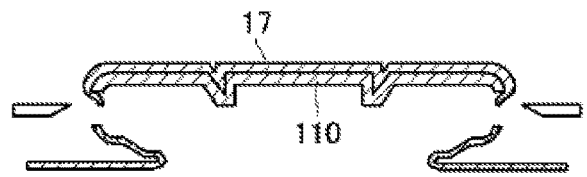
FIG. 10 is an explanatory view illustrating an unnecessary portion being trimmed from the base member formed in the forming apparatus according to the first embodiment.

After the decorative film 17 is brought into close contact with the base member 110 by pressurization in the accommodation space R1, the upper chamber box 103 is lifted as shown in FIG. 9, and the base member 110 with which the decorative film 17 has been brought into close contact is extracted. Subsequently, as shown in FIG. 10, an unnecessary portion may be trimmed and removed, thereby eliminating a portion of the decorative film 17 which is protruded from the base member 110 and inhibits assembly of the product.

As described above, the watertight structure of the touch panel device 10 according to this embodiment includes: the display panel 12 constituting a display screen; the touch panel 14 which is disposed outside the display panel 12 and on which an input operation is performed; and the enclosure 16 which holds the display panel 12 and the touch panel 14 and has the opening 16a to which the touch panel 14 is exposed. The watertight structure is configured such that the thermoplastic decorative film 17 is brought into close contact with the surface of the touch panel device 10 around the entire periphery thereof so that there exists no excessive portion of the decorative film 17 that is protruded from the surface of the touch panel device 10.

This configuration enables the thermoplastic decorative film 17 brought into close contact with the surface of the touch panel device 10 to prevent the entry of a liquid such as water into the enclosure 16 of the touch panel device 10. Since there exists no excessive portion of the decorative film 17 that is protruded from the surface of the touch panel device 10, no projected portion of the decorative film 17 that would otherwise cause trouble at the time of assembly of the touch panel device 10 is found, thereby improving the ease of assembly.

Furthermore, the watertight structure is implemented by the decorative film 17 being brought into close contact with the surface of the touch panel device 10. This eliminates the need of providing watertightness by bonding together the opening 16a and the touch panel 14, which constitute the touch panel device 10, thereby simplifying the manufacture of the touch panel device 10. Furthermore, since watertight parts such as O-rings need not to be used, parts counts and man-hours for assembly can be reduced.

Furthermore, the decorative film 17 may also be used not to cover the entire periphery of the touch panel device 10 but to cover at least the opening 16a. Since this configuration allows the opening 16a to be covered with the decorative film 17, it is possible to prevent the entry of a liquid such as water through the gap 25 between the touch panel 14 and the enclosure 16 on the opening 16a.

Second Embodiment

Figure 11:
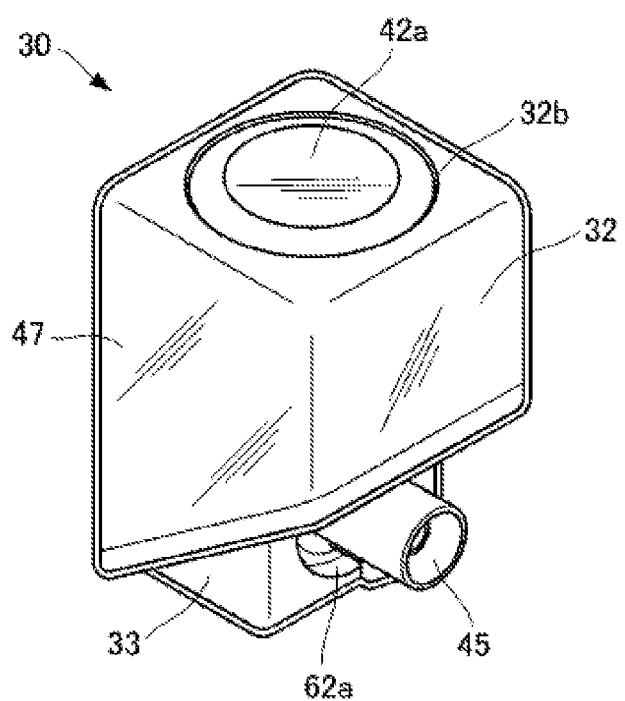
FIG. 11 is a perspective view illustrating an outer appearance of a camera module according to a second embodiment.
Figure 12:
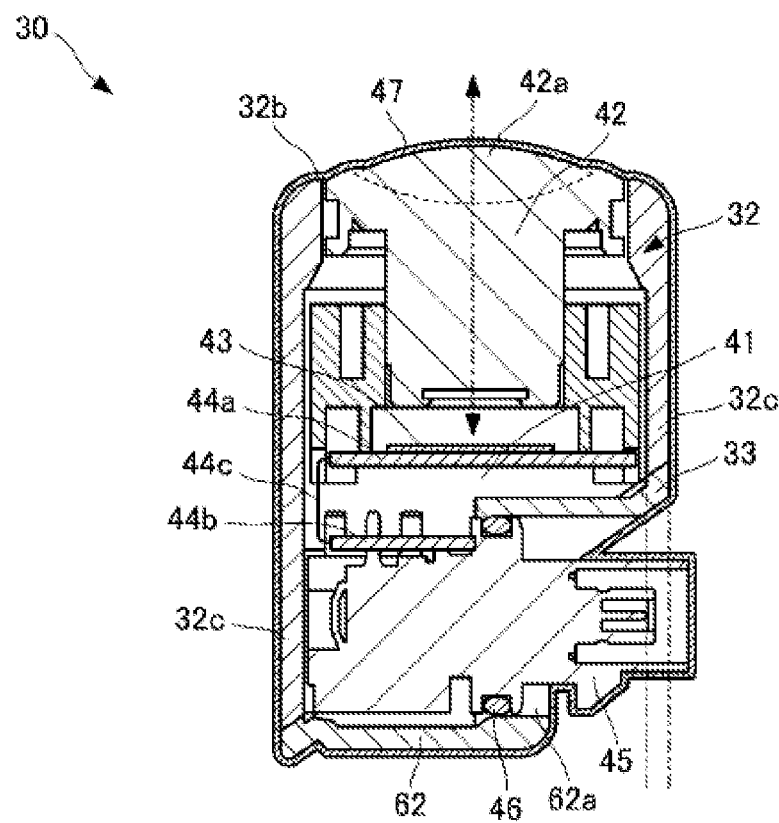
FIG. 12 is a longitudinal cross-sectional view illustrating the camera module according to the second embodiment.
Figure 13A:
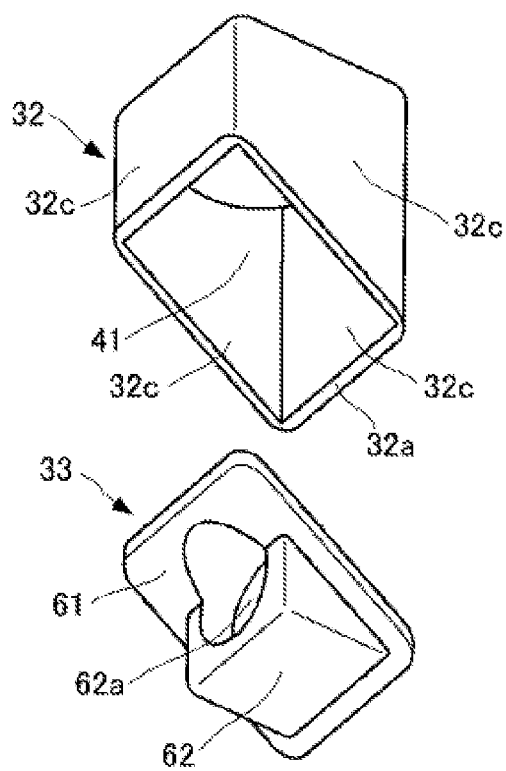
FIG. 13A is a view illustrating an outer appearance of a first casing and a second casing of the camera module according to the second embodiment before being bonded together.
Figure 13B:
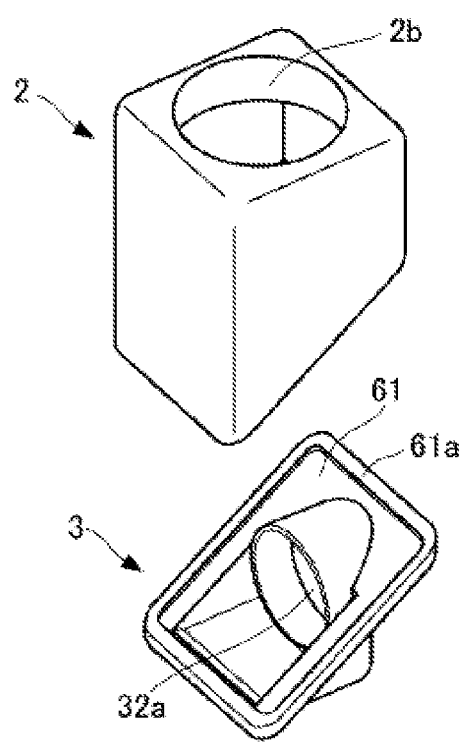
FIG. 13B is a view illustrating an outer appearance of a first casing and a second casing of the camera module according to the second embodiment before being bonded together.

In this embodiment, a camera module is taken as an electronic device by way of example, and referring to FIGS. 11 to 13B, a description will be given of the watertight structure of the camera module. FIG. 11 is a perspective view illustrating the outer appearance of a camera module 30 according to this embodiment, FIG. 12 is a view of a central longitudinal cross-sectional view of the camera module 30 shown in FIG. 11, and FIG. 13A and FIG. 13B are an exploded view illustrating only a first casing 32 and a second casing 33.

The camera module 30 is mainly used by being attached to the rear portion of the body of a vehicle (not shown) or to the right and left sides, i.e., used to grasp the situation of the range of a blind spot mainly from the driver's seat of the vehicle. For example, the camera module 30 may be mounted on the rear portion and the right and left sides of the vehicle body, and then images acquired from the respective four camera modules 30 may be processed and combined. This allows for virtually constructing a type of view monitor system that displays a bird's eye view of the vehicle as viewed from immediately above.

The camera module 30 has a generally rectangular parallelepiped box-shaped body with an accommodation portion 41 therein, and is formed by bonding together the first casing 32 forming the upper side of the camera module 30 and the second casing 33 forming the lower side thereof. The accommodation portion 41 accommodates and holds a lens unit 42, an image capturing element 43, printed circuit boards 44, as will be discussed later. In this embodiment, the two casings are combined to constitute the camera module 30. However, two or more casings may also be combined to constitute the camera module 30.

The entire periphery of the camera module 30 is in close contact with a decorative film 47 that is processed by the TOM construction method mentioned in the first embodiment. An excessive portion of the decorative film 47 which is not in close contact with the surface of the camera module 30, that is, which is protruded from the surface of the camera module 30 has been cut off in advance by trimming as will be discussed later. Thus, there exists no excessive portion of the decorative film 47. The TOM construction method employed in this embodiment will not be repeatedly explained because what is different is only to employ the camera module 30 as a base member.

The decorative film 47 is brought into close contact with the camera module 30 in order to provide watertightness. For this reason, the decorative film 47 may not be brought into close contact with the entire periphery of the camera module 30, but may cover at least an opening 32b and a bonded portion formed by bonding together a first bonding surface 32a and a second bonding surface 61a.

The decorative film 47 to be employed is formed of polyethylene terephthalate, but may also be formed of another raw material so long as the material is thermoplastic. Examples of the other materials to be used may include polybutylene terephthalate, polyethylene naphthalate, polyimide, polyamide, polycarbonate, polyvinyl chloride, polyethylene, polypropylene, and polystyrene. Furthermore, the decorative film 47 is desirably transparent.

The first casing 32 is in the shape of a box that has an upper surface and four sidewall surfaces 32c, the lower side is obliquely opened generally at an angle of 45°, and the inside is a cavity that serves as the accommodation portion 41. The upper surface of the first casing 32 includes the circular opening 32b, to which the top of the lens unit 42 accommodated in the accommodation portion 41 is exposed. An objective lens 42a is provided at the center of the exposed lens unit 42, so that the camera module 30 captures an image acquired through the objective lens 42a.

Here, for providing watertightness in a related camera module, the portions equivalent to between the opening 32b and the lens unit 42 were adhered and bonded together in a watertight manner. However, the camera module 30 according to this embodiment exhibits a watertight effect by bringing the decorative film 47 into close contact with the entire periphery. Thus, the opening 32b and the lens unit 42 may not always be adhered to each other as described above. Thus, the watertight structure of the camera module 30 according to this embodiment can reduce man-hours for assembly of the camera module 30.

The second casing 33 has: an inclined section 61 provided by being tilted at an angle corresponding to the angle of the opened portion of the first casing 32; and a box-shaped section 62 that is protruded in a rectangular shape from the inclined section 61. The box-shaped section 62 has a cavity therein, and with the first casing 32 and the second casing 33 being bonded together, the cavities of the box-shaped section 62 and the first casing 32 are connected together, thereby forming the accommodation portion 41 of the camera module 30. The box-shaped section 62 is provided, on a side thereof, with an external connection opening 62a, from which a coaxial connector socket 45 serving as external connection means is protruded out of the camera module 30 in the horizontal direction.

In a related structure, for providing watertightness, between the inner circumferential surface of the external connection opening 62a and the outer circumferential surface of the coaxial connector socket 45 is provided an O-ring (the portion denoted by 46 in FIG. 12) which is formed of an elastic silicon rubber. Between these two circumferential surfaces, the O-ring is in close contact with the respective circumferential surfaces with the O-ring being moderately compressed, preventing the entry of water droplets into the accommodation portion 41. However, the camera module 30 according to this embodiment exhibits a watertight effect by bringing the decorative film 47 into close contact with the entire periphery. Thus, an O-ring may not always be provided between the inner circumferential surface of the external connection opening 62a and the outer circumferential surface of the coaxial connector socket 45 as described above. Thus, the watertight structure of the camera module 30 according to this embodiment can reduce the parts count of the camera module 30.

The coaxial connector socket 45 is mounted by soldering on a second printed circuit boards 44b, which is located at a lower position, of the two printed circuit boards 44 held in the accommodation portion 41. The tip portion of the coaxial connector socket 45 is protruded from the range that is defined by extending one of the sidewall surfaces 32c of the first casing 32. Note that "the range that is defined by extending one of the sidewall surfaces 32c of the first casing 32" refers to an inner range defined by an imaginary wall surface, which is assumed by imaginarily extending the sidewall surfaces 32c, as indicated with a chain double-dashed line in FIG. 12.

The coaxial connector socket 45 can be connected with a wiring cable (not shown) provided at the tip thereof with an adequate coaxial connector plug for a mating counterpart. Depending on the total length or the total width of a vehicle on which the camera module 30 is mounted, a wiring cable of a required length is prepared. This enables the camera module 30 to be mounted with flexibility onto vehicles of various sizes and at various positions such as the rear portion or the side portion of the same vehicle.

The lens unit 42 has a well-known structure, which holds a plurality of circular lenses including a convex lens disposed at the uppermost position or the objective lens 42a (illustrated by a broken line in the figure) in a cylindrical lens barrel. The plurality of circular lenses are concentrically held along an optical axis A or a straight line along a direction orthogonal to the center of the image capturing surface of the image capturing element 43 (the vertical direction as illustrated). Note that concerning the structure relating to the inside of the lens unit 42, for example, the number of lenses held and the separation between the lenses may be arbitrarily set to obtain desired optical properties. Since this is not directly related to the technical features of the embodiment of the present invention, the structure of the inside of the lens unit 42 is illustrated in a simplified manner in the drawings.

The image capturing element 43 is a planar image capturing element of a well-known CMOS type, and is mounted on and secured to the first printed circuit board 44a, which is located at an upper position, of the two printed circuit boards 44 held in the accommodation portion 41. The first printed circuit board 44a and the second printed circuit board 44b are electrically connected by a flexible cable 44c, so that an electrical signal corresponding to image data captured by the image capturing element 43 is outputted from the aforementioned external connection means.

In this embodiment, the first casing 32 and the second casing 33 are formed of a polyamide resin having a good weather resistance. The first casing 32 and the second casing 33 may also be formed of any other synthetic resin if the material meets required criteria, such as strength or weather resistance, or the bonding strength for bonding together the first casing 32 and the second casing 33.

The first casing 32 and the second casing 33 are bonded together in a manner such that the first bonding surface 32a positioned around an opened portion of the four sidewall surfaces 32c constituting the first casing 32 and the second bonding surface 61a positioned around an opened portion of the inclined section 61 of the second casing 33 are brought into contact with each other to bond together both the bonding surfaces. The bonded portion constitutes the casing bonded portion according to the embodiment of the present invention. Note that the peripheral walls of the first casing 32 and the second casing 33 defining the first bonding surface 32a and the second bonding surface 61a have a generally uniform thickness, and the bonding surfaces have generally the same width along the entire periphery.

In a related structure, the portions equivalent to between the first bonding surface 32a and the second bonding surface 61a were bonded together in a watertight manner by ultrasonic welding for providing watertightness. However, the camera module 30 according to this embodiment exhibits a watertight effect by bringing the decorative film 47 into close contact with the entire periphery. Thus, the aforementioned ultrasonic welding may not always have to be carried out. Thus, the watertight structure of the camera module 30 according to this embodiment can reduce man-hours for assembly of the camera module 30.

As described above, the watertight structure of the camera module 30 according to this embodiment is configured such that the camera module 30 has: the accommodation portion 41 formed by bonding together the first casing 32 and the second casing 33 formed of a synthetic resin; the lens unit 42 including the objective lens 42a at the top of the accommodation portion 41; the image capturing element 43; and the printed circuit boards 44. One of the first casing 32 and the second casing 33 has the opening 32b on the upper surface for exposing the objective lens 42a. The thermoplastic decorative film 47 is brought into close contact with the entire periphery of the surface of the camera module 30 in a manner such that there exists no excessive portion of the decorative film 47 that would be protruded from the surface of the camera module 30.

This configuration enables the thermoplastic decorative film 47 brought into close contact with the surface of the camera module 30 to prevent the entry of a liquid such as water into the first casing 32 and the second casing 33 of the camera module 30. Since there exists no excessive portion of the decorative film 47 protruded from the surface of the camera module 30, no projected portion of the decorative film 47 that would otherwise cause trouble at the time of assembly of the camera module 30 is found, thereby improving the ease of assembly.

Furthermore, the watertight structure is configured by the decorative film 47 being brought into close contact with the surface of the camera module 30. This eliminates the need of providing watertightness by bonding together the opening 16a and the touch panel 14, which constitute the touch panel device 10, thereby simplifying the manufacture of the camera module 30. Furthermore, since watertight parts such as O-rings need not to be used, parts counts and man-hours for assembly can be reduced.

Furthermore, the decorative film 47 may also be used not to cover the entire periphery of the camera module 30 but to cover at least the opening 32b and the casing bonded portion at which the first bonding surface 32a and the second bonding surface 61a of the first casing 32 and the second casing 33 are bonded together. This configuration allows the opening 16a to be covered with the decorative film 47, and thus makes it possible to prevent the entry of a liquid such as water through the casing bonded portion and the opening 32b.

Third Embodiment

In this embodiment, taking a connector as an example, the watertight structure of the connector will be described. A description will be given of a card connector by way of example. However, another type connector may also be employed.

Figure 14:
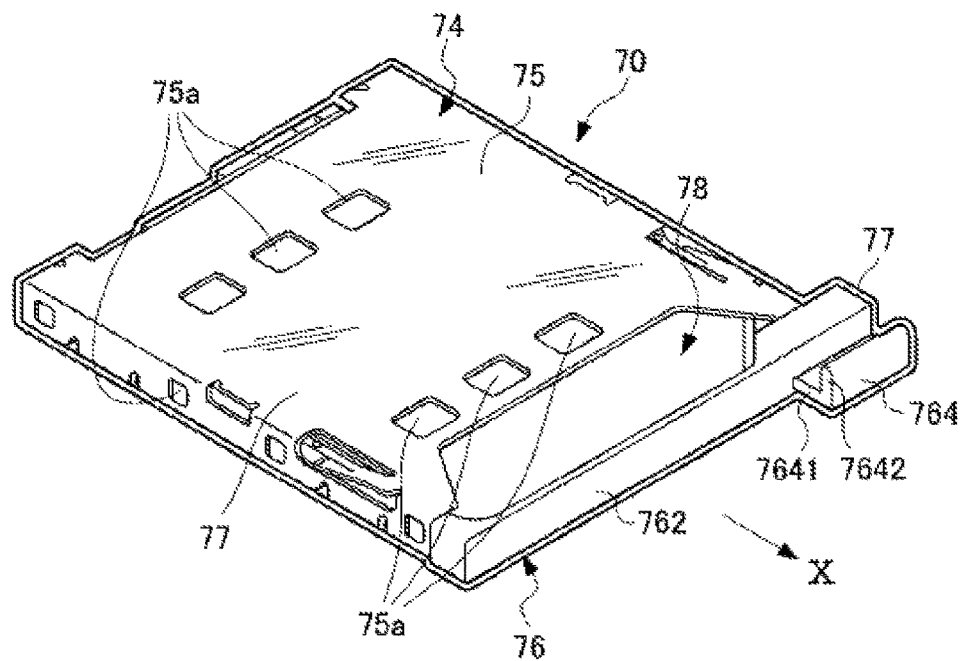
FIG. 14 is a perspective view illustrating a card connector according to a third embodiment.

As shown in FIG. 14, a card connector 70 includes a housing 75 into or from which a tray 76 to accommodate a SIM card 78 or the tray 76 accommodating a SIM card is inserted or ejected. On the surface of the housing 75 are provided a plurality of holes 75a. The periphery of the card connector 70 except an opening 71 is in close contact with a decorative film 77 that has been processed by the TOM construction method discussed in the first embodiment. The TOM construction method employed in this embodiment will not be repeatedly explained because what is different is only to employ the card connector 70 as a base member.

The decorative film 77 to be employed is formed of polyethylene terephthalate, but may also be formed of another raw material so long as the material is thermoplastic. Examples of the other materials may include polybutylene terephthalate, polyethylene naphthalate, polyimide, polyamide, polycarbonate, polyvinyl chloride, polyethylene, polypropylene, and polystyrene. Furthermore, the decorative film 77 is desirably transparent.

The tray 76 is set in the housing 75 so as to be movable in the arrow X direction or in the tray eject direction in which the tray 76 is ejected from the card connector 70 and in a direction opposite to the arrow X direction or in the tray insertion direction. The tray 76 also includes at least a bottom wall portion 760 (not illustrated) and a front wall portion 762 vertically intersecting the bottom wall portion 760, and is configured to accommodate the SIM card 78 on the tray 76. Furthermore, the tray 76 is provided, on one side portion of the front wall portion 762, with a grip portion 764 which is protruded from the front wall portion 762 in the arrow X direction and a tip portion of which extends further above, the grip portion being shaped in a letter L in cross section.

The grip portion 764 has a horizontal portion 7641 which is horizontally protruded frontward from the front wall portion 762, that is, in the arrow X direction, and a vertical portion 7642, which is provided at the top of the horizontal portion 7641 and extends upwardly perpendicular to the horizontal portion 7641. The horizontal portion 7641 preferably extends frontward from the front wall portion 762 along the bottom wall portion 760 of the tray 76 or in parallel to the bottom wall portion 760. Furthermore, the tray 76, including the grip portion 764, may preferably be formed of an electrically insulating synthetic resin by injection molding.

Figure 15:
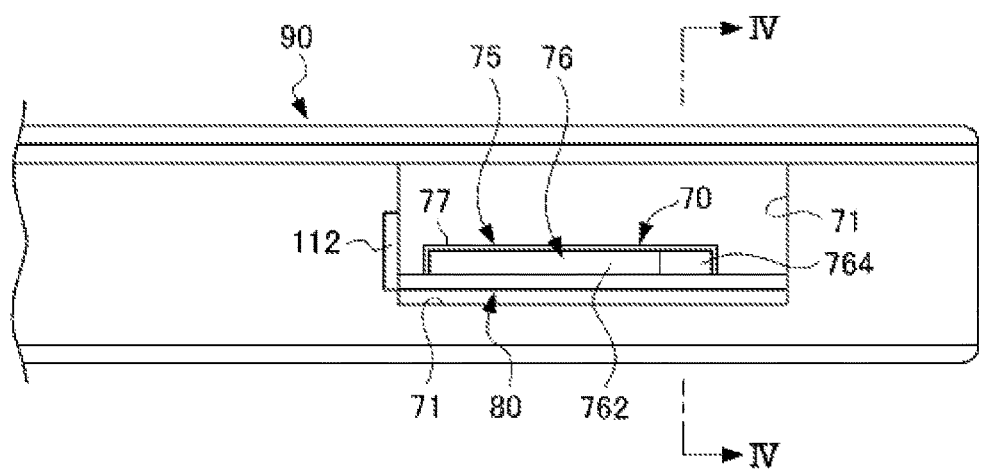
FIG. 15 is a partially enlarged side view illustrating an electronic device to which a card connector according to the third embodiment is mounted.

As shown in FIG. 15, the card connector 70 is secured onto a circuit board 80 of an electronic device so as to be disposed to face the opening 71 formed on the sidewall of a casing 90, for example, of the electronic device. More specifically, the card connector 70 is disposed in the casing 90 of the electronic device so that the opening 71 and the insertion opening (not shown) of the housing 75 into which the tray 76 accommodating the SIM card 78 is inserted are aligned.

The tray 76 accommodating the SIM card 78 is inserted into the card connector 70 to a predetermined position, thereby allowing the SIM card 78 to be electrically connected to the circuit board 80 of the electronic device, for example, through a contact (not shown). At this time, as shown in FIG. 15, the front wall portion 762 of the tray 76 faces the opening 71.

In a related structure, the casing 90 of the electronic device was sealed for providing watertightness by fitting a watertight cap into the opening 71 of the casing 90 of the electronic device. To provide an improved watertight effect, the watertight cap was provided with a concavo-convex surface in contact with a sidewall of the casing 90 defining the opening 71 and formed of a flexible material such as a silicon rubber.

Figure 16:
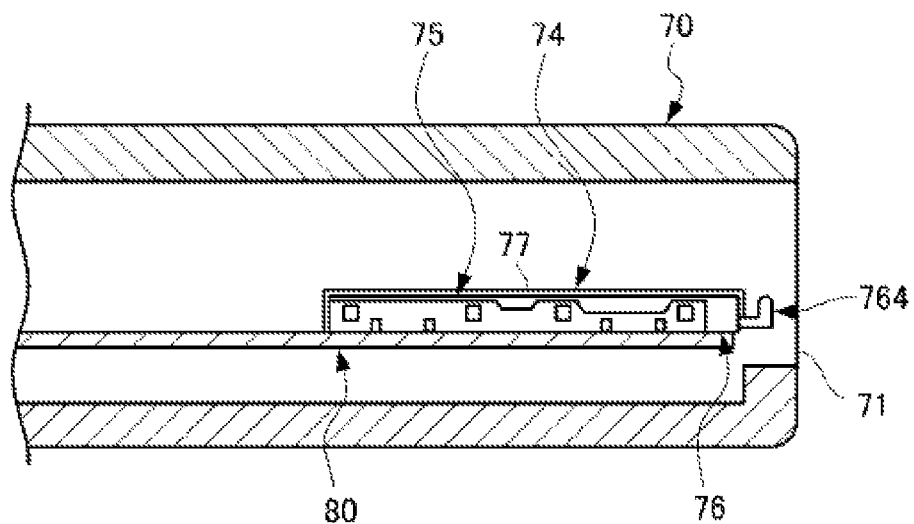
FIG. 16 is a cross-sectional view, taken along line IV-IV of FIG. 15, illustrating a main portion of the electronic device with the card connector according to the third embodiment.
Figure 17:
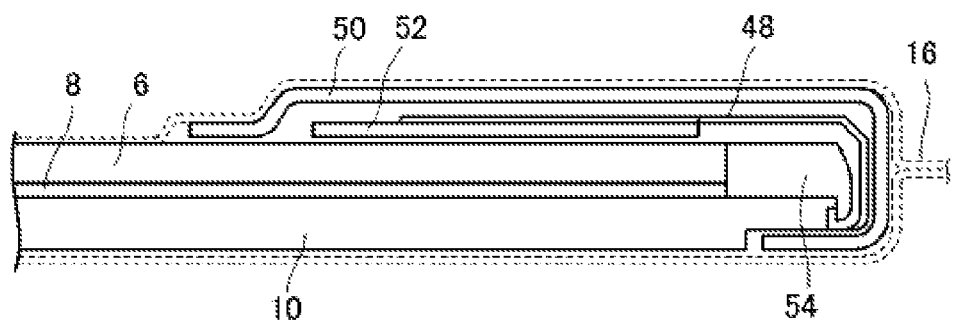
FIG. 17 is a cross-sectional view illustrating a related touch panel device.

However, the watertight cap needs to be removed when an IC card such as a SIM card is inserted into the opening 71, so that water may enter into the card connector 70 through an opening of the electronic device, and the resulting water may possibly pass through the holes 75a of the housing 75 into the electronic device. Thus, in the card connector 70 according to this embodiment, as shown in FIG. 16, the decorative film 77 is brought into close contact with the surface of the housing 75 including the holes 75a, thereby preventing the entry of water through the holes 75a from the card connector 70 into the electronic device. This eliminates the need of providing a watertight cap and thus enables parts counts to be reduced.

As described above, the watertight structure of the card connector 70 according to this embodiment is configured such that the housing 75 having the plurality of holes 75a to be used for an electronic device includes the opening 71 and the tray 76 that can accommodate the SIM card 78, and the surface of the card connector 70 is brought into close contact with the thermoplastic decorative film 77 except the opening 71.

This configuration allows the card connector 70 to be brought into close contact and covered with the decorative film 77. It is thus possible to prevent a liquid such as water, which have entered from outside into the card connector 70, from entering into the electronic device through the holes 75a. Furthermore, it is possible to easily manufacture the watertight structure of the card connector 70 and reduce parts counts and man-hours for assembly.

On the other hand, the thermoplastic decorative film 77 may also be brought into close contact with a plurality of holes 75a on the surface of the card connector 70. This configuration allows the decorative film 77 to be brought into close contact with the plurality of holes 75a on the surface of the card connector 70. This makes it possible to prevent the entry of a liquid such as water into the electronic device with a less amount of the decorative film 77 as compared with the case in which the decorative film is in close contact with the entire periphery.

As described above, the watertight structure of an electronic device and the watertight structure of a connector according to the embodiment(s) of the present invention improve the ease of assembly of the electronic device, facilitate manufacturing, and reduce parts counts and man-hours for assembly, and are applicable generally to the watertight structures of electronic devices and the watertight structures of connectors.

REFERENCE SIGNS LIST 10 touch panel device
12 display panel
14 touch panel
16 enclosure
16a opening
17, 47, 77 decorative film (film)
30 camera module
32 first casing
32b opening
32c sidewall surface
33 second casing
34 casing bonded portion
41 accommodation portion
42 lens unit
42b objective lens
43 image capturing element
44 printed circuit board
70 card connector
71 opening (IC card insertion port)
75 housing
75a hole
76 tray
78 SIM card (IC card)
100 forming apparatus
110 base member

The invention claimed is:

1. A watertight structure of a connector, wherein a thermoplastic film is brought into close contact with a surface of the connector including a housing having a plurality of holes to be used with an electronic device, and
the thermoplastic film is brought into close contact with the plurality of holes on the surface of the connector.

2. A watertight structure of a connector, wherein a thermoplastic film is brought into close contact with a surface of the connector including a housing having a plurality of holes to be used with an electronic device,
   the connector includes an IC card insertion port in the housing, and
   the thermoplastic film is brought into close contact with the surface of the connector except the IC card insertion port.

\* \* \* \* \*